US012685166B2

(12) United States Patent
Kim et al.

(10) Patent No.: US 12,685,166 B2
(45) Date of Patent: Jul. 14, 2026

(54) SEMICONDUCTOR DEVICE AND METHOD FOR MAKING THE SAME

(71) Applicant: STATS ChipPAC Pte. Ltd., Singapore (SG)

(72) Inventors: ChangOh Kim, Incheon (KR); SeungHyun Lee, Incheon (KR); HeeSoo Lee, Incheon (KR)

( * ) Notice: Subject to any disclaimer, the term of this patent is extended or adjusted under 35 U.S.C. 154(b) by 379 days.

(21) Appl. No.: 18/475,238

(22) Filed: Sep. 27, 2023

(65) Prior Publication Data

US 2024/0112981 A1 Apr. 4, 2024

(30) Foreign Application Priority Data

Sep. 29, 2022 (CN) .......................... 202211203151.8

(51) Int. Cl.
H10W 40/70 (2026.01)
H10W 20/20 (2026.01)
(Continued)

(52) U.S. Cl.
CPC ........... H10W 40/70 (2026.01); H10W 20/20 (2026.01); H10W 40/037 (2026.01);
(Continued)

(58) Field of Classification Search
CPC ...... H10W 20/20; H10W 40/70; H10W 90/00
See application file for complete search history.

(56) References Cited

U.S. PATENT DOCUMENTS 11,393,805 B2 7/2022 Yu et al.
2021/0272930 A1* 9/2021 Choi ................... H10W 70/685
(Continued)

FOREIGN PATENT DOCUMENTS

CN 217011519 U 7/2022
TW M435811 U1 8/2012
(Continued)

OTHER PUBLICATIONS

AMD Ryzen 7 5800X3D Review—The Magic of 3D V-Cache retrieved from the link https://www.techpowerup.com/review/amd-ryzen-7-5800x3d/2.html.

*Primary Examiner* — Steven M Page
(74) *Attorney, Agent, or Firm* — .Junhe Law Office, P.C.; Yi Zhang

(57) ABSTRACT

A semiconductor device comprises a substrate; a primary semiconductor die attached onto the substrate comprising a front surface and a back surface, wherein the primary semiconductor die has a first region and a second region besides the first region; an auxiliary semiconductor die attached onto the front surface at the first region; a heat transfer block comprising a main body attached onto the front surface at the second region; a metal layer wrapping around the main body; a graphene layer formed outside of the metal layer; a heat spreader attached onto the substrate and defining with the substrate a chamber for accommodating the primary semiconductor die, the auxiliary semiconductor die and the heat transfer block, wherein the graphene layer extends between the heat spreader and the front surface such that heat generated by the first region can be transferred to the heat spreader through the graphene layer.

18 Claims, 8 Drawing Sheets

(51) Int. Cl.
| | |
|---|---|
| *H10W 40/00* | (2026.01) |
| *H10W 40/22* | (2026.01) |
| *H10W 90/00* | (2026.01) |
| *H10W 90/28* | (2026.01) |

(52) U.S. Cl.
CPC ........... *H10W 40/22* (2026.01); *H10W 90/00* (2026.01); *H10W 90/28* (2026.01); *H10W 90/736* (2026.01)

(56) References Cited

U.S. PATENT DOCUMENTS

| | | | | |
|---|---|---|---|---|
| 2021/0320078 A1* | 10/2021 | Zinn | ..................... | H10W 76/60 |
| 2022/0310480 A1* | 9/2022 | Bao | ...................... | H10W 40/70 |

FOREIGN PATENT DOCUMENTS

| | | |
|---|---|---|
| TW | 201842635 A | 12/2018 |
| TW | 202105647 A | 2/2021 |
| TW | 202226471 A | 7/2022 |

* cited by examiner

504a —

504d —
504a —

504b

504d

504a

504

504b     504c

504d

504a

SEMICONDUCTOR DEVICE AND METHOD FOR MAKING THE SAME

TECHNICAL FIELD

The present application generally relates to semiconductor technology, and more particularly, to a semiconductor device and a method for making a semiconductor device.

BACKGROUND OF THE INVENTION

Recently, 3D vertical cache technology has been used in semiconductor integrated circuits. For example, Advanced Micro Devices, Inc. (AMD) launched a new semiconductor package using direct copper-to-copper bonding and through silicon vias (TSVs) to stack an additive 3D L3 cache die onto an on-die L3 cache of a core complex die, such that the capacity of the L3 caches of the semiconductor package is dramatically increased. In addition, two structural silicon blocks are attached besides the additive 3D L3 cache die to provide a stable structure for the semiconductor package.

However, the additive 3D L3 cache and two structural silicon blocks stacked on the core complex die impede heat dissipation of the core complex die, and heat that cannot be dissipated timely may accumulate within the package and harm the performance of the core complex die.

Therefore, a need exists for a semiconductor device with improved heat management.

SUMMARY OF THE INVENTION

An objective of the present application is to provide a semiconductor device with improved heat management.

According to an aspect of embodiments of the present application, a semiconductor device is provided. The semiconductor device comprises a substrate; a primary semiconductor die with a front surface and a back surface opposite to the front surface, wherein the primary semiconductor die has a first region and a second region besides the first region, and the primary semiconductor die is attached onto the back surface of the substrate; an auxiliary semiconductor die attached onto the front surface of the primary semiconductor die at the first region; a heat transfer block attached onto the front surface of the primary semiconductor die at the second region, the heat transfer block comprises a main body; a metal layer wrapping around the main body; and a graphene layer formed outside of the metal layer; and a heat spreader attached onto the substrate and defining with the substrate a chamber for accommodating the primary semiconductor die, the auxiliary semiconductor die and the heat transfer block, wherein the graphene layer extends between the heat spreader and the front surface of the primary semiconductor die such that heat generated by the first region of the primary semiconductor die can be transferred to the heat spreader through the graphene layer.

According to another aspect of the present application, a method for making the semiconductor devices according to the above aspects are provided. The method comprises: providing a substrate; providing a primary semiconductor die having a front surface and a back surface opposite to the front surface, wherein the primary semiconductor die has a first region and a second region besides the first region; mounting the primary semiconductor die onto the substrate through the front surface; attached an auxiliary semiconductor die onto the front surface of the primary semiconductor die at the first region; providing a heat transfer block comprising a main body, a metal layer wrapping around the main body and a graphene layer formed outside of the metal layer; attaching the heat transfer block onto the front surface of the primary semiconductor die at the second region; and attaching a heat spreader onto the substrate to define a chamber for accommodating the primary semiconductor die, the auxiliary semiconductor die and the heat transfer block, wherein the graphene layer extends between the heat spreader and the front surface of the primary semiconductor die such that heat generated by the first region of the primary semiconductor die can be transferred to the heat spreader through the graphene layer.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one sub-unit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
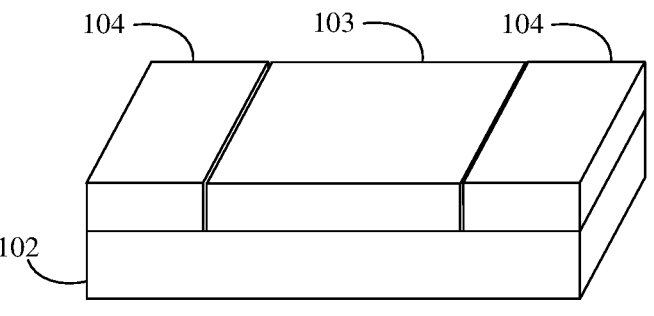
FIGS. 1A to 1C are schematic views illustrating a semiconductor device according to an embodiment of the present application.
Figure 1B:
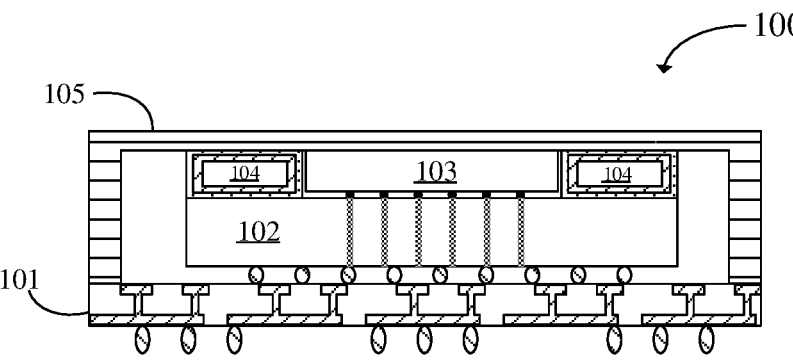
Figure 1C:
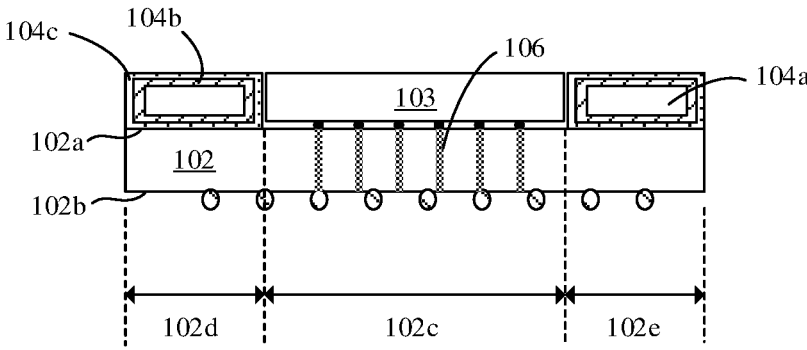

FIGS. 1A to 1C are schematic views illustrating a semiconductor device 100 according to an embodiment of the present application. FIGS. 1A and 1C illustrate a perspective view and a sectional view of the semiconductor device 100 with its heat spreader and substrate removed. FIG. 1B illustrates a sectional view of the semiconductor device 100.

As shown in FIGS. 1A to 1C, the semiconductor device 100 includes a substrate 101, and a primary semiconductor die 102 mounted on the substrate 101. The semiconductor device 100 further includes an auxiliary semiconductor die 103 and two heat transfer blocks 104 mounted on the primary semiconductor die 102. For purpose of heat dissipation, a heat spreader 105 is attached to the substrate 101. The heat spreader 105 defines with the substrate 101 a chamber for accommodating the primary semiconductor die 102, the auxiliary semiconductor die 103 and the heat transfer block 104.

In some embodiments, the substrate 101 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The insulating layers may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The substrate 101 can also be a multi-layer flexible laminate, ceramic, copper clad laminate, glass, or semiconductor wafer including an active surface containing one or more transistors, diodes, and other circuit elements to implement analog circuits or digital circuits. The substrate 101 may include one or more electrically conductive layers or redistribution layers (RDL) formed using sputtering, electrolytic plating, electroless plating, or other suitable deposition process. The substrate conductive patterns may be one or more layers of Al, Cu, Sn, Ni, Au, Ag, titanium (Ti), tungsten (W), or other suitable electrically conductive material.

As shown in FIG. 1C, the primary semiconductor die 102 has a front surface 102a and a back surface 102b which is opposite to the front surface 102a. When view from the top of the primary semiconductor die 102, it has a first region 102c in the middle, and a second region 102d and a third region 102e besides the first region 102c and at two sides of the first region 102c, respectively. The primary semiconductor die 102 is attached onto the substrate 101 through solder balls or other similar structures on the back surface 102b of the substrate 101, for example. In this way, the primary semiconductor die 102 can be electrically coupled to the substrate 101 and further to external devices through the substrate 101. In some embodiments, the primary semiconductor die 102 may be a digital signal processor, a microcontroller, a microprocessor, a network processor, an audio processor, a video processor, a memory controller, a memory device or other similar circuitry, which requires a significant area of semiconductor substrate.

The auxiliary semiconductor die 103 is attached onto the front surface 102a of the primary semiconductor die 102 in the first region 102c. The auxiliary semiconductor die 103 may have a size or area smaller than that of the primary semiconductor die 102. In this way, the primarily semiconductor die 102 is only partially covered by the auxiliary semiconductor die 103, leaving a least a portion of its front surface 102a uncovered. The primary semiconductor die 102 may be electrically connected with the auxiliary semiconductor die 103 through interconnect structures (e.g., copper-to-copper bonding) formed therebetween. In the embodiment shown in FIG. 1C, there are a plurality of through silicon vias (TSVs) 106 passing through the primary semiconductor die 102, such that the auxiliary semiconductor die 103 stacked on the primary semiconductor die 102 can be electrically coupled to the substrate 101 directly via the TSVs 106. For example, the primary semiconductor die 102 can be an active TSV die (i.e., with an active circuit such as a data processing circuit), or a TSV interposer (i.e., without an active circuit or without a substantive circuit other than certain interconnect circuit). As such, the functionality or capability of the primary semiconductor die 102 can be enhanced by the auxiliary semiconductor die 103. For example, the primary semiconductor die 102 may be a microprocessor with a cache memory, and the auxiliary semiconductor die 103 may be a standalone cache memory die. When the primary semiconductor die 102 is connected with the auxiliary semiconductor die 103, the storage space of cache memory available to the other circuits in the primary semiconductor die 102 can be significantly increased. In this example, the cache memory in the primary semiconductor die 102 can be formed in the middle of the primary semiconductor die 102, and right below the auxiliary semiconductor die 103.

As aforementioned, the two heat transfer blocks 104 are attached onto the front surface 102a of the primary semiconductor die 102 in the second region 102d and in the third region 102e, respectively. The heat transfer blocks 104 are also in contact with the heat spreader 105. In this way, the heat transfer blocks 104 can transfer heat from the primary semiconductor die 102 to the heat spreader 105, which further dissipates heat to the environment. In the embodiment shown in FIGS. 1A to 1C, each of the heat transfer blocks 104 is shaped as a cuboid, but it can be appreciated that the heat transfer blocks can be formed with other suitable shapes. It can be appreciated that the number of heat transfer blocks may vary depending on the configuration of the auxiliary semiconductor die. For example, if the auxiliary semiconductor die is attached in the first and third regions of the primary semiconductor die, rather than only attached in the first region shown in FIG. 1C, then only one heat transfer block may be needed, i.e., attached in the second region of the primary semiconductor die.

Each heat transfer block 104 may have a main body 104a, a metal layer 104b and a graphene layer 104c. The metal layer 104b wraps around the main body 104a, which provides a base for the graphene layer 104c to be formed outside the main body 104a, because it is generally difficult to form graphene directly on the main body 104a made of silicon or other similar semiconductor materials. Furthermore, the graphene layer 104c is formed outside the metal layer 104b. In this way, the graphene layer 104c can be in contact with both the primary semiconductor die 102 and the heat spreader 105, and create a thermal path between them. The graphene layer 104c is an allotrope of carbon consisting of at least one layer of carbon atoms arranged in a two-dimensional honeycomb lattice, which has a low moisture permeability and a very high thermal conductivity of 4000 W/mK at room temperature. In some embodiments, the metal layer 104b may be made of copper which has a thermal conductivity of 400 W/mK, while the graphene layer 104c has a thermal conductivity even ten times of that of the copper layer 104b. Due to the superior thermal performance of graphene, heat generated by the first region 102c of the primary semiconductor die 102 can be transferred to the heat spreader 105 through the graphene layer 104c. Furthermore, since carbon also has a good solderability and wettability to solder paste, it is easy to attach the heat spreader 105 onto the graphene layer 104c.

In some embodiments, chemical vapor deposition (CVD) can be used to form the graphene layer 104c and attach it onto the metal layer 104b. For example, during the CVD process, a carbon source can be positioned within a reaction chamber. The carbon source can decompose under a high temperature, releasing carbon atoms that may be further deposited on the metal layer. The carbon atoms deposited on the metal layer accumulate and eventually form a continuous graphene layer outside the metal layer. In some embodiments, the metal layer 104b can be made of copper (Cu) or nickel (Ni), however, it can be appreciated that any suitable metal layer can be used as a base layer for the deposition of the graphene layer.

Still referring to FIGS. 1B and 1C, in some embodiments, the main body 104a of the heat transfer block 104 is a structural silicon block, which may be formed of silicon that has a low coefficient of thermal expansion (CTE) and matches with the silicon material of the primary semiconductor die 102. When the heat transfer block 104 absorbs heat from the primary semiconductor die 102, it can maintain its shape without significant deformation, due to the low CTE of the silicon main body 104a. In some embodiments, the main body 104a can be metal, such as copper or nickel. As such, the main body 104a and the metal layer 104b can be a same material or different materials.

In some embodiments, each heat transfer block 104, as well as the inside main body 104a, is shaped as a cuboid. And the metal layer 104b may cover a top surface, a bottom surface and at least one lateral surface of the main body 104a of the heat transfer block 104. Preferably, as in the embodiment shown in FIGS. 1A to 1C, the metal layer 104b may cover an entirety of the outer surface of the main body 104a, such that the graphene layer 104c coated outside the metal layer 104b can have a biggest surface area. A bigger contact area between the graphene layer 104c and the primary semiconductor die 102 can further improve heat transfer from the primary semiconductor die 102 to the heat spreader 105 via the graphene layer 104c. It should be noted that the graphene layer 104c may cover an entirety of the outer surface of the metal layer 104b, or may partially cover the outer surface of the metal layer 104b as long as the graphene layer 104c sufficiently fills between the primary semiconductor die 102 and the heat spreader 105.

It can be understood that the two heat transfer blocks 104 attached onto the primary semiconductor die 102 may occupy the respective gaps besides the auxiliary semiconductor die 103, therefore it is desired that the heat transfer blocks 104 have a height substantially equal to a height of the auxiliary semiconductor die 103. In this way, respective top surfaces of the heat transfer blocks 104 may flush with a top surface of the auxiliary semiconductor die 103, which facilitates the attachment of these blocks to the heat spreader 105.

Figure 2:
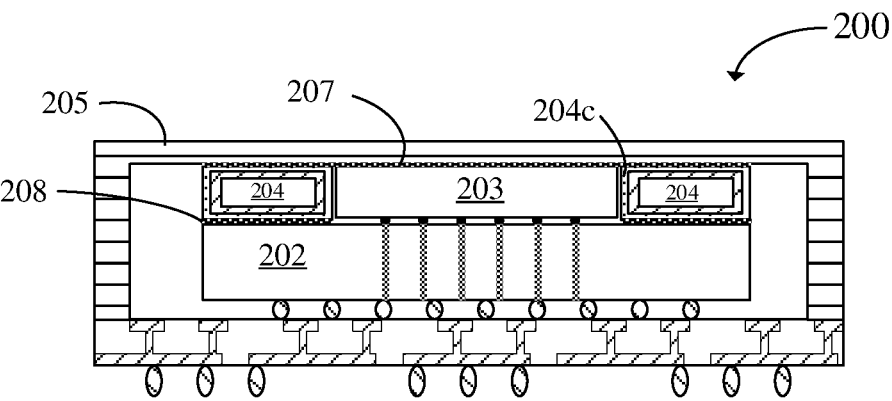
FIG. 2 is a sectional view illustrating a semiconductor device according to another embodiment of the present application.

FIG. 2 is a sectional view illustrating a semiconductor device 200 according to another embodiment of the present application.

As illustrated in FIG. 2, different from the semiconductor device 100 shown in FIGS. 1A to 1C, the semiconductor device 200 includes a first thermal interface layer 207 formed between a heat spreader 205 and an auxiliary semiconductor die 203 and/or between the heat spreader 205 and heat transfer blocks 204. The first thermal interface layer 207 further improves heat dissipation from the heat transfer blocks 204 and the auxiliary semiconductor die 203 to the heat spreader 205. Furthermore, the semiconductor device 200 includes a second thermal interface layer 208 formed between the heat transfer blocks 204 and the primary semiconductor die 202. Similarly, the second thermal interface layer 208 can improve heat transfer from the primary semiconductor die 202 to the heat transfer blocks 204. In some embodiments, a thermal interface material of the first thermal interface layer 207 and/or the second thermal interface layer 208 can be thermally conductive, dispensable materials, preferably thermal greases, thermal adhesives, thermal gap fillers, liquid metal, and solder paste. In some embodiments, the first and second thermal interface layers 207 and 208 can be made of an epoxy compound, which may be used for easy bonding to metals, ceramics, most plastics and a wide variety of other materials. In another embodiment, the first and second thermal interface layers 207 and 208 may include solder paste which has improved thermal conductivity over typical thermal interface material. Preferably, the solder paste is Ag—In solder alloy. Specifically, the first and second thermal interface layers 207 and 208 may be a solder preform, that is, a solid, flat, manufactured-shape of solder, and a flux may be applied to coat the solder preform.

Figure 3:
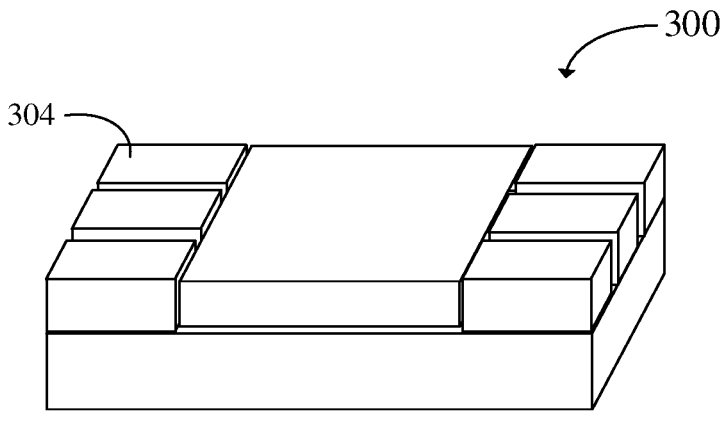
FIG. 3 is a schematic diagram illustrating a semiconductor device according to yet another embodiment of the present application.
Figure 4:
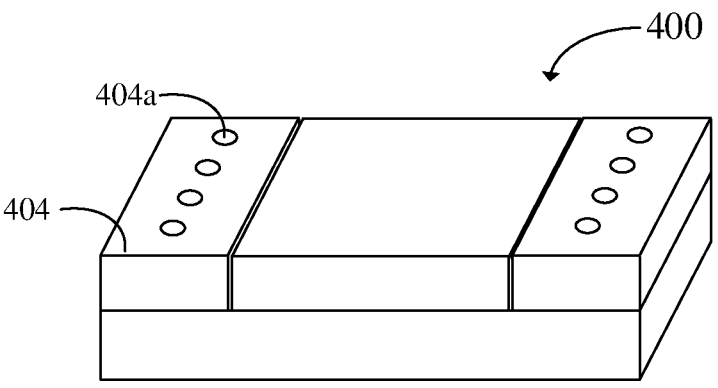
FIG. 4 is a schematic diagram illustrating a semiconductor device according to yet another embodiment of the present application.

FIGS. 3 and 4 are schematic diagrams illustrating two semiconductor devices according to other embodiments of the present application. In FIGS. 3 and 4, respective heat spreaders and substrates of the semiconductor devices are removed for ease of observation.

In the embodiment shown in FIG. 3, each heat transfer block 304 at a side of the auxiliary semiconductor die is separated into a plurality of segments, and each segment is wrapped with a metal layer and further a graphene layer (not shown). The graphene layers between adjacent segments provide additional heat transfer paths from the primary semiconductor die to the heat spreader, and thus improve the heat performance of the semiconductor device 300. In some embodiments, for each heat transfer block, its separated segments can be made separately, and assembled together as a single piece. Afterwards, the assembled heat transfer blocks can be attached onto the primary semiconductor die.

In the embodiment shown in FIG. 4, each heat transfer block 404 includes a plurality of through holes 404a. For each through hole 404a, a metal layer and a graphene layer can be filled within the through hole 404a, which is coated on an inner sidewall of the through hole 404a. In some examples, the through holes 404a can be made using mechanical drilling, laser ablation or the like. For example, the metal layer can be first formed on the inner sidewall of the through hole 404a, which does not fill an entirety of the through hole 404a. Then, the graphene layer can be filled within the through hole 404a and occupy the remaining space. Therefore, the graphene layers filled in the through holes 404a provide additional heat transfer paths from the primary semiconductor die to the heat spreader, other than the graphene layers coated outside the heat transfer block, and thus further improve the heat performance of the semiconductor device 400.

FIGS. 5A to 5D show a method for making a heat transfer block according to an embodiment of the present application.

Figure 5A:
FIGS. 5A to 5D shows a method for making a heat transfer block according to an embodiment of the present application.
Figure 5B:
Figure 5C:
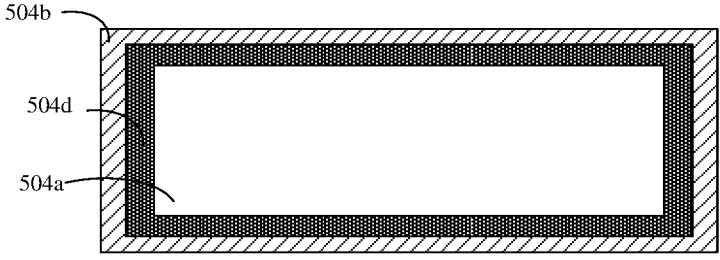
Figure 5D:
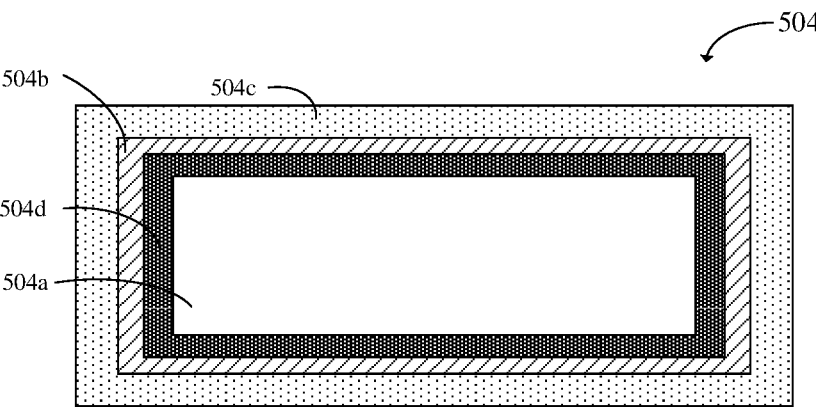

As shown in FIG. 5A, a main body 504a is provided. The main body 504a can be made of silicon, for example. Next, as shown in FIG. 5B, an adhesion layer 504d can be formed on an outer surface of the main body 504a, which can be used to increase adhesion of a metal layer to the main body 504a. In some embodiments, the adhesion layer 504d includes stainless steel (SuS) or titanium (Ti), and the metal layer 504b includes Cu or Ni. It can be appreciated that the adhesion layer 504d is optional, which may not be formed in some embodiments. Afterwards, as shown in FIG. 5C, a metal layer 504b is coated on the main body 504a through the adhesion layer 504d, using any suitable metal deposition process such as plating, sputtering, CVD, Physical Vapor Deposition (PVD), spraying, printing or the like. Next, a graphene layer 504c is formed on an outer surface of the metal layer 504b, and thus the heat transfer block 504 can be formed.

In some embodiments, the graphene layer 504c can be formed as a single layer, while in some alternative embodiments, the graphene layer 504c may be formed as a multiple layer. In some other embodiments, the main body 504a can include Cu or Ni, thereby the graphene layer 504c can be directly coated over the main body 504a. As such, the intermediate metal layer 504b is omitted.

FIGS. 6A to 6E show a method for making the semiconductor device shown in FIG. 2 according to an embodiment of the present application. It can be appreciated that the method can be modified to make other semiconductor devices such as those shown in FIGS. 1A to 1C, 3 and 4, according to some embodiment of the present application.

Figure 6A:
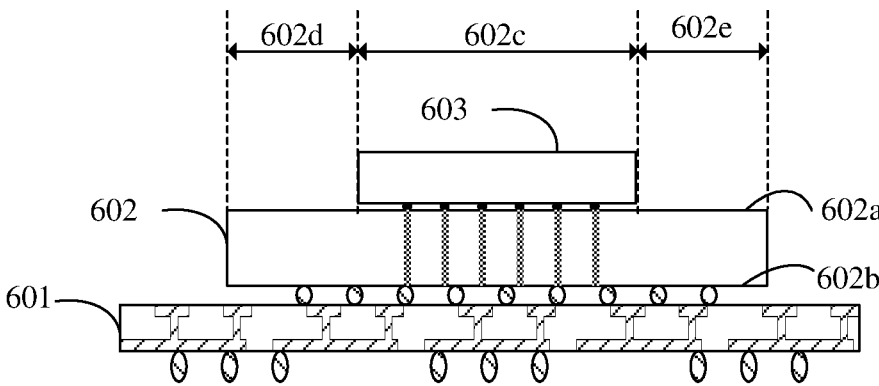
FIGS. 6A to 6E show a method for making the semiconductor device shown in FIG. 2 according to an embodiment of the present application.
Figure 6B:
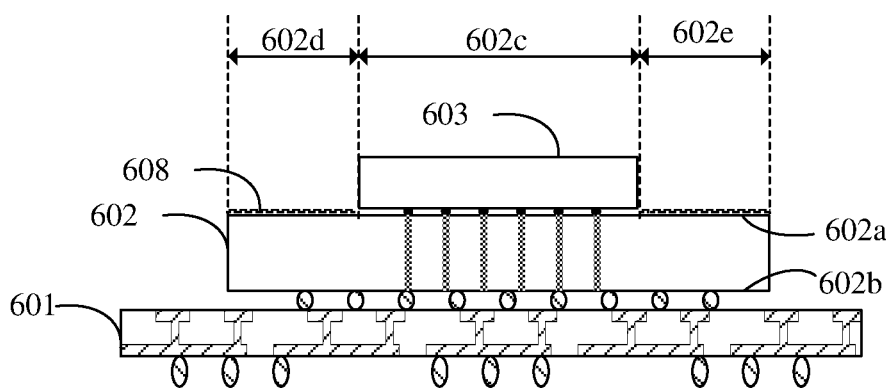

Referring to FIG. 6A, a substrate 601 is provided, and a primary semiconductor die 602 is mounted onto the substrate 601. The primary semiconductor die 602 has a front surface 602a and a back surface 602b, the primary semiconductor die 602 further has a first region 602c, a second region 602d and a third region 602e. Furthermore, as shown in FIG. 6B, an auxiliary semiconductor die 603 is attached onto the front surface 602a of the primary semiconductor die 602 in the first region 602c. Optionally, thermal interface layers 608 are respectively formed on the front surface 602a in the second region 602d and the third region 602e.

Figure 6C:
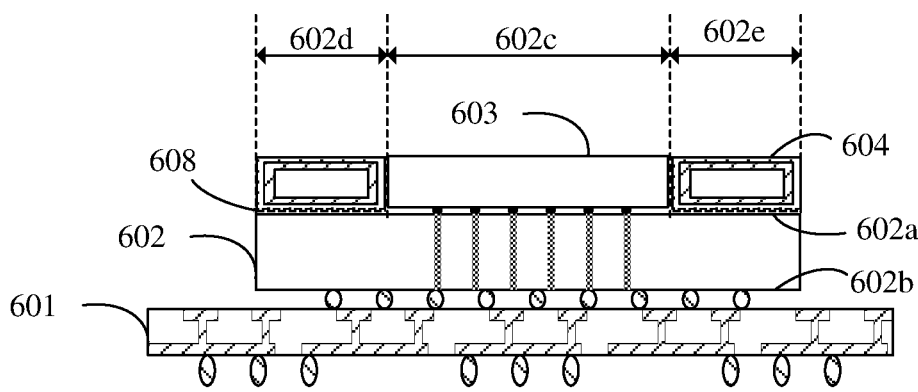
Figure 6D:
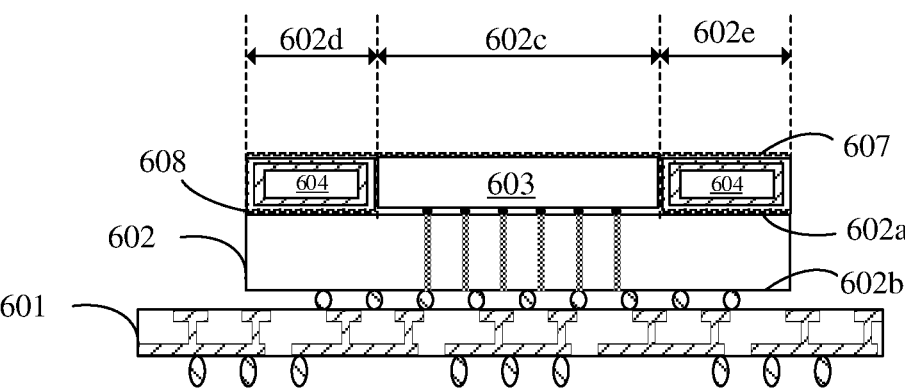
Figure 6E:
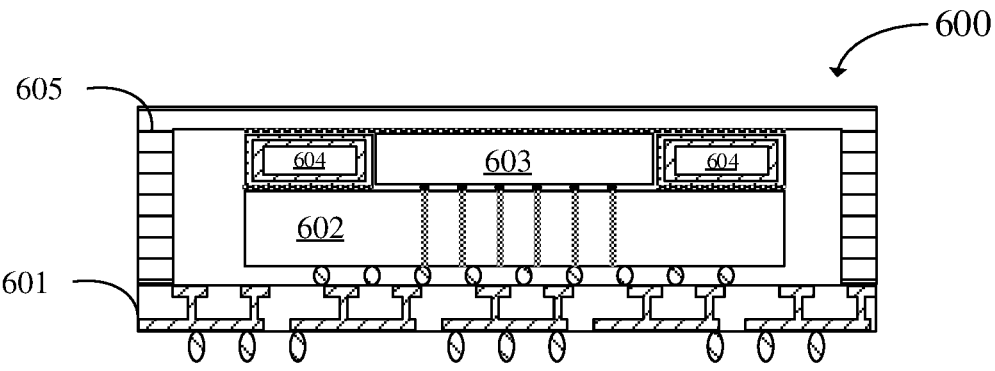

Turning to FIG. 6C, two heat transfer blocks 604 are respectively attached onto the front surface 602a in the second region 602d and the third region 602e. Optionally, another thermal interface layer 607 can be formed on top surfaces of the auxiliary semiconductor die 603 and the heat transfer blocks 604, as shown in FIG. 6D. In some embodiments, the thermal interface layer 607 can be formed only on the auxiliary semiconductor die 603. In some other embodiments, the thermal interface layer 607 can be formed on the heat transfer blocks 604. Afterwards, as shown in FIG. 6E, a heat spreader 605 is attached onto the substrate 601 and defines a chamber for accommodating the primary semiconductor die 602, the auxiliary semiconductor die 603 and the heat transfer blocks 604. The auxiliary semiconductor die 603 and/or the heat transfer blocks 604 may be directly in contact with an inner surface of the heat spreader 605, or be connected with the inner surface of the heat spreader 605 via the thermal interface layer 607.

The discussion herein included numerous illustrative figures that showed various portions of a semiconductor device and method for making the semiconductor device. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A semiconductor device, comprising:
   a substrate;
   a primary semiconductor die with a front surface and a back surface opposite to the front surface, wherein the primary semiconductor die has a first region and a second region besides the first region, and the primary semiconductor die is attached onto a back surface of the substrate;
   an auxiliary semiconductor die attached onto the front surface of the primary semiconductor die at the first region;
   a heat transfer block attached onto the front surface of the primary semiconductor die at the second region, the heat transfer block comprising:
      a main body;
      a metal layer wrapping around the main body; and
      a graphene layer formed outside of the metal layer; and
   a heat spreader attached onto the substrate and defining with the substrate a chamber for accommodating the primary semiconductor die, the auxiliary semiconductor die and the heat transfer block, wherein the graphene layer extends between the heat spreader and the front surface of the primary semiconductor die such that heat generated by the first region of the primary semiconductor die can be transferred to the heat spreader through the graphene layer.

2. The semiconductor device of claim 1, wherein the primary semiconductor die further comprises a third region besides the first region, and the third region and the second region are at two sides of the first region, and wherein the semiconductor device further comprises another heat transfer block attached onto the front surface of the primary semiconductor die at the third region.

3. The semiconductor device of claim 1, wherein the heat transfer block comprises a plurality of segments, and each segment is wrapped with the metal layer and the graphene layer.

4. The semiconductor device of claim 1, wherein the heat transfer block comprises a plurality of through holes, and the metal layer and the graphene layer are coated on an inner surface of the through holes.

5. The semiconductor device of claim 1, wherein the heat transfer block comprises an adhesion layer between the metal layer and the main body.

6. The semiconductor device of claim 1, wherein the heat transfer block is of a height substantially equal to that of the auxiliary semiconductor die.

7. The semiconductor device of claim 1, wherein the metal layer is a copper layer.

8. The semiconductor device of claim 1, further comprising a first thermal interface layer formed between the heat spreader and the auxiliary semiconductor die.

9. The semiconductor device of claim 8, wherein the first thermal interface layer is at least partially formed between the heat transfer block and the heat spreader.

10. The semiconductor device of claim 1, further comprising a second thermal interface layer formed between the heat transfer block and the front surface of the primary semiconductor die at the second region.

11. The semiconductor device of claim 1, wherein the primary semiconductor die is a Through Silicon Via (TSV) die.

12. A method for making a semiconductor device, the method comprising:

providing a substrate;

providing a primary semiconductor die having a front surface and a back surface opposite to the front surface, wherein the primary semiconductor die has a first region and a second region besides the first region;

mounting the primary semiconductor die onto the substrate through the front surface;

attached an auxiliary semiconductor die onto the front surface of the primary semiconductor die at the first region;

providing a heat transfer block comprising a main body, a metal layer wrapping around the main body and a graphene layer formed outside of the metal layer;

attaching the heat transfer block onto the front surface of the primary semiconductor die at the second region; and attaching a heat spreader onto the substrate to define a chamber for accommodating the primary semiconductor die, the auxiliary semiconductor die and the heat transfer block, wherein the graphene layer extends between the heat spreader and the front surface of the primary semiconductor die such that heat generated by the first region of the primary semiconductor die can be transferred to the heat spreader through the graphene layer.

13. The method of claim 12, wherein the step of providing a heat transfer block comprises:

providing a plurality of segments, and each segment is wrapped with the metal layer and the graphene layer.

14. The method of claim 12, wherein the step of providing a heat transfer block comprises:

forming a plurality of through holes;

coating the metal layer on an inner surface of the through holes; and coating the graphene layer onto the metal layer.

15. The method of claim 12, wherein the step of providing a heat transfer block comprises:

coating an adhesion layer onto the main body;

coating the metal layer on the adhesion layer; and coating the graphene layer on the metal layer.

16. The method of claim 12, wherein the step of attaching a heat spreader onto the substrate comprises:

forming a first thermal interface layer between the heat spreader and the auxiliary semiconductor die.

17. The method of claim 16, wherein the step of forming a first thermal interface layer between the heat spreader and the auxiliary semiconductor die comprises:

forming the first thermal interface layer at least partially between the heat transfer block and the heat spreader.

18. The method of claim 12, wherein the step of attaching the heat transfer block onto the front surface of the primary semiconductor die at the second region comprises:

forming a second thermal interface layer between the heat transfer block and the front surface of the primary semiconductor die at the second region.

* * * * *